United States Patent
Ge et al.

(10) Patent No.: US 10,648,915 B2
(45) Date of Patent: May 12, 2020

(54) SUBSTANCE DETECTION DEVICE

(71) Applicant: Hewlett-Packard Development Company, L.P., Houston, TX (US)

(72) Inventors: Ning Ge, Palo Alto, CA (US); Steven Barcelo, Palo Alto, CA (US); Anita Rogacs, Palo Alto, CA (US); Helen A Holder, Palo Alto, CA (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 114 days.

(21) Appl. No.: 15/764,327

(22) PCT Filed: Nov. 30, 2015

(86) PCT No.: PCT/US2015/063039
§ 371 (c)(1),
(2) Date: Mar. 29, 2018

(87) PCT Pub. No.: WO2017/095383
PCT Pub. Date: Jun. 8, 2017

(65) Prior Publication Data
US 2018/0284028 A1    Oct. 4, 2018

(51) Int. Cl.
*G01N 21/65*    (2006.01)
*G01N 21/64*    (2006.01)
*G01J 3/44*     (2006.01)
*B65B 31/06*    (2006.01)
*B81C 1/00*     (2006.01)

(52) U.S. Cl.
CPC .......... *G01N 21/658* (2013.01); *B65B 31/06* (2013.01); *B81C 1/00293* (2013.01); *G01J 3/44* (2013.01); *G01N 21/648* (2013.01); *B81B 2201/0214* (2013.01); *B81C 2203/0145* (2013.01)

(58) Field of Classification Search
CPC .... G01N 21/648; G01N 21/658; B65B 31/06; G01J 3/44; B81B 2201/0214; B81C 1/00293; B81C 2203/0145
See application file for complete search history.

(56) References Cited

U.S. PATENT DOCUMENTS 4,870,800 A    10/1989    Kasai
2006/0146323 A1    7/2006    Bratkovski et al.
(Continued)

FOREIGN PATENT DOCUMENTS

WO    WO-2010073260 A1    7/2010
WO    WO-2014142912 A1 *  9/2014    ............. C23C 18/32

OTHER PUBLICATIONS

Costello, S. et al.; Review of Test Methods Used for the Measurement of Hermeticity in Packages Containing Small Cavities ; Jan. 18, 2012; https://pureapps2.hw.ac.uk/portal/files/1014311/SMillar_Hermiticity_test_methods.pdf>.
(Continued)

*Primary Examiner* — Hina F Ayub
*Assistant Examiner* — Amanda Merlino
(74) *Attorney, Agent, or Firm* — Nathan R. Rieth

(57) ABSTRACT

In an example implementation, a substance detection device includes a chamber with chamber walls, a chamber top, and a chamber bottom. A substrate comprises imprinted nanostructures positioned within the chamber, and the substrate is coupled to the chamber walls to form the chamber bottom. An inert gas is sealed within the chamber.

12 Claims, 4 Drawing Sheets

(56) References Cited

U.S. PATENT DOCUMENTS

| | | |
|---|---|---|
| 2007/0086002 A1 | 4/2007 | Islam et al. |
| 2007/0153267 A1 | 7/2007 | Wang et al. |
| 2012/0113420 A1 | 5/2012 | Kuo et al. |
| 2012/0162640 A1 | 6/2012 | Sakagami |
| 2013/0244337 A1 | 9/2013 | Meinhart et al. |
| 2014/0170316 A1 | 6/2014 | Shibuya et al. |
| 2014/0198314 A1 | 7/2014 | Li et al. |

OTHER PUBLICATIONS

Costello, S. et al. "Review of test methods used for the measurement of hermeticity in packages containing small cavities." IEEE Transactions on components, packaging and manufacturing technology 2, No. 3 (2012): 430-438.

\* cited by examiner

SUBSTANCE DETECTION DEVICE

BACKGROUND

Surface Enhanced Raman Spectroscopy (SERS) may be used in various industries to detect the presence of an analyte. For example, SERS may be used in the security industry to detect and/or scan for explosives (e.g., detecting and/or scanning baggage at airports for explosives and/or other hazardous materials). Alternatively, SERS may be used in the food industry to detect toxins or contaminants in water and/or milk.

BRIEF DESCRIPTION OF THE DRAWINGS

Examples will now be described with reference to the accompanying drawings, in which.

Throughout the drawings, identical reference numbers designate similar, but not necessarily identical, elements.

DETAILED DESCRIPTION

Figure 1:
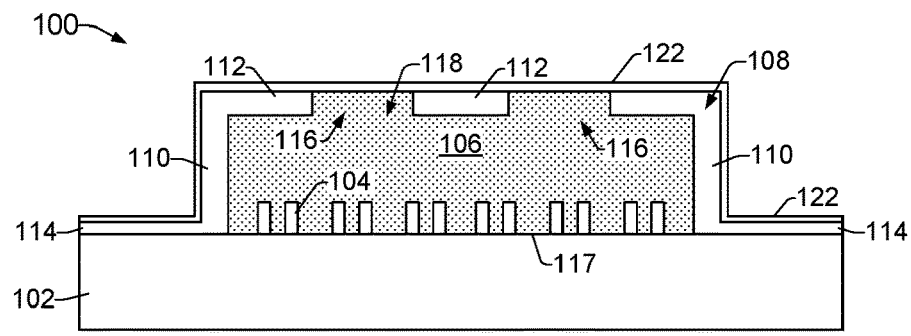
FIG. 1 shows an example of a substance detection device.

The integration of SERS technology into microfluidic devices such as lab-on-a-chip (LOC) devices has applicability across a range of industries, including various life science and other industries for purposes such as biomedical diagnostics, drug development, DNA replication, and so on. Such testing devices can include substrates with nanostructures to facilitate the measurement of liquid samples, for example, to detect and identify various substances. The proper functioning of some substance detection devices can depend in part on protecting the substrates of the devices from contamination. Premature exposure of the substrate and nanostructures to the environment and/or a substance (e.g., an analyte) that the substrate is intended to detect can reduce the effectiveness of the device to detect the substance once the device substrate is intentionally exposed to the substance.

Attaching the substrate to a housing is one way to help protect the substrate and nanostructures within a substance detection device from such premature exposure. A housing may comprise, for example, a chamber that encloses the nanostructures and has openings to enable the introduction and removal (e.g., evaporation) of a sample solution that may contain a substance of interest that the substrate is intended to detect. Prior to the introduction of a sample into the chamber and testing for a substance of interest, the openings in the chamber can be temporarily sealed off to prevent premature exposure to the environment and/or a substance of interest. However, the application of a temporary seal over the chamber openings can enclose ambient air and other particulate matter within the chamber. The ambient air can expose the substrate and nanostructures to oxygen, moisture, and other particulate matter within the air. Undesirable chemical reactions such as oxidation and hydrolysis reactions can occur with the oxygen and moisture contained in the ambient air, as well as with other particulate matter. Oxidation of the substrate and nanostructures can reduce the effectiveness of the detection device to detect a substance once the device substrate is intentionally exposed to the substance.

Accordingly, examples of a substance detection device and methods of making/fabricating a substance detection device are described herein that reduce the exposure of the substrate and nanostructures to such reactive elements. In various examples, a substance detection device includes nanostructures nanoimprinted onto a substrate and enclosed within a chamber. In one illustrated example, the chamber includes walls and a top defined by a three-dimensional (3D) orifice plate that is bonded to the substrate. In other examples, a chamber can be defined in other ways, such as with a two-dimensional (2D) orifice plate forming a chamber top supported by chamber walls fabricated onto the substrate. Openings in the top of the chamber can be sealed closed with a removable barrier to prevent premature exposure and contamination of the substrate and nanostructures. Prior to applying the removable barrier to seal the openings, an inert gas can be introduced into the chamber. The inert gas helps to avoid unwanted chemical reactions, such as oxidation, from degrading the substrate and nanostructures. In some examples, the inert gas is sealed within the chamber by a total seal that covers not just the chamber openings, but the entire outer surface of the chamber housing, including the chamber top and the chamber walls. The total seal helps to prevent molecules of the inert gas from escaping the chamber.

In an example implementation, a substance detection device includes a chamber with chamber walls, a chamber top, and a chamber bottom. A substrate comprises imprinted nanostructures that are positioned within the chamber, and the substrate is coupled to the chamber walls to form the chamber bottom. An inert gas is sealed within the chamber.

In another example implementation, a method of making a substance detection device includes imprinting nanostructures onto a substrate, and enclosing the nanostructures within a chamber. The method also includes introducing an inert gas into the chamber, and sealing the chamber to prevent the inert gas from escaping the chamber.

In another example implementation, a substance detection device includes nanostructures imprinted onto a substrate. The nanostructures are positioned within a chamber, and inert gas is sealed within the chamber by a removable seal that covers openings in the chamber. In some examples, the removable seal comprises a total seal to cover the entire outside surface of the chamber, including the chamber top, chamber walls, and coupling portions used to couple the chamber walls to the substrate.

Figure 2:
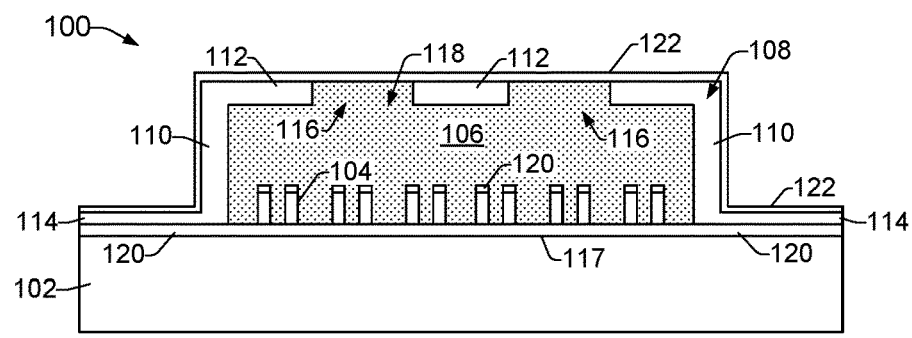
FIG. 2 shows an example of a substance detection device with additional details of components of the device.

FIG. 1 is an illustration of an example substance detection device 100 that reduces exposure of its detection components to undesirable reactive elements. FIG. 2 is an illustration of the example substance detection device 100 showing some additional details of components of the device. As shown in FIGS. 1 and 2, an example substance detection device 100 includes a substrate 102 comprising nanostructures 104 imprinted onto the substrate 102 in a nanoimprint process. The substrate 102 can be made of any suitable flexible material such as glass, plastic, Polydimethylsiloxane, a transparent material, rubber and/or a membrane, for example. The nanoimprinted nanostructures 104 can be made of an imprintable material such as a polymer imprint resist material. The imprintable material comprises a curable material such as a photo (UV) or thermal curable polymer resist. In different examples, the nanostructures 104 may be referred to variously as nano-fingers, nano-pillars, sensing fingers, sensing pillars, and so on. The nanostructures 104 are to react to a substance when exposed to the substance within a chamber 106, for example, when a liquid sample containing the substance is introduced into the chamber 106.

The chamber 106 in which the nanostructures 104 are positioned, includes chamber walls 110, a chamber top 112, and coupling portions 114 to couple the chamber 106 to the substrate 102. The chamber top 112 includes openings 116 that can function, for example, as fluidic inlet bores. The substrate 102 defines a bottom 117 to the chamber 106, and the coupling portions 114 of the 3D orifice plate 108 can be bonded to the substrate 102 to enclose and position the nanostructures 104 within the chamber 106.

In various examples illustrated and described herein, such as in FIGS. 1-6, a three-dimensional (3D) orifice plate 108 is shown as defining portions of the chamber 106, including the chamber walls 110, the chamber top 112, and the coupling portions 114. However, while a chamber 106 is described herein as being defined by such a 3D orifice plate 108, the 3D orifice plate 108 is used merely by way of example and is not intended to be a limitation as to other ways in which a chamber 106 may be defined and/or fabricated. Thus, the chamber 106 and portions of the chamber, including the chamber walls 110, the chamber top 112, and the coupling portions 114, can be formed in other ways than the described 3D orifice plate. For instance, in other examples a chamber 106 can be formed with a top and walls fabricated using thin-film microfabrication techniques, nanoimprint technology, and so on. The top and walls and coupling portions of a chamber can be formed of various materials including metals, polymer resist materials, and so on.

Referring again to the example in FIGS. 1 and 2, a 3D orifice plate 108 comprises a rigid plate that can be made of any suitable material such as metal, nickel, gold and/or platinum, for example. The 3D orifice plate 108 can be formed, for example, in an electroplating process in which a mandrel is immersed in a plating bath that plates a surface of the mandrel with a metal material (e.g., nickel, gold, platinum, etc.) everywhere except where a nonconductive material such as silicon carbide is located. The metal from the plating bath defines patterns, shapes and/or features of the orifice plate 108, such as openings 116. After the mandrel and the orifice plate 108 are removed from the plating bath, the orifice plate 108 can be removed and/or peeled off of the mandrel.

As shown in FIGS. 1 and 2, an example substance detection device 100 can include an inert gas 118 sealed within the chamber 106. The inert gas 118 can be introduced into the chamber 118, for example, during manufacture of the substance detection device 100. The inert gas 118 generally comprises any gas that has a low chemical reactivity such that it does not readily react with many substances. Such inert gases include, for example, nitrogen (N2), argon (Ar), helium (He), neon (Ne), Krypton (Kr), and Xenon (Xe). The inert gas 118 helps to prevent oxidation and other undesirable reactions from occurring with the substrate 102, nanostructures 104, and sensing material 120 discussed in more detail herein below with reference to FIG. 2.

FIGS. 1 and 2 also show the example substance detection device 100 as including a removable barrier 122 covering at least a portion of the 3D orifice plate 108. The removable barrier 122 comprises a removable seal 122 to enclose the chamber 106 and protect the substrate 102, nanostructures 104, and sensing material 120 from premature exposure to the environment and/or a substance of interest. The removable seal 122 also traps the inert gas 118 within the chamber 106 and prevents it from escaping. In some examples, the removable seal 122 comprises a hermetic seal that can be formed of a material that is specifically selected to correspond with the type of inert gas 118 within the chamber 106 in a manner that more effectively prevents molecules of the inert gas 118 from leaking out of the chamber 106. For example, some materials used for the removable seal 122 may be more or less effective in preventing the inert gas 118 from leaking out depending on the size of molecules of the type of inert gas 118 used in the chamber 106. Thus, the removable seal 122 can be made of various materials including, for example, polymer tape, plastic material, transparent material, plastic sheeting, foil material (e.g., aluminum, copper, tin, gold), foil sheeting, a membrane, wax and/or Polydimethylsiloxane, and so on. In some examples the removable seal 122 comprises a transparent seal to enable a reading device to take measurements of the nanostructures 104 and sensing material 120 while the seal 122 is attached to the chamber 106.

In general, the removable seal 122 covers the openings 116 in the chamber 106 (e.g., the 3D orifice plate 108) to protect the substrate 102, nanostructures 104, and sensing material 120 from premature exposure, and to keep the inert gas 118 from escaping the chamber 106. In some examples, however, such as are shown in FIGS. 1 and 2, the removable seal 122 comprises a total seal 122 that covers the entire outer surface of the chamber 106, including the chamber top 112, the chamber walls 110, and the coupling portions 114. In the example shown in FIGS. 1 and 2, the removable seal 122 can comprise a total seal 122 that covers the chamber openings 116 formed in the 3D orifice plate 108, the top 112 portion of the chamber 106 formed by the 3D orifice plate 108, the walls 110 of the chamber 106 formed by the 3D orifice plate 108, and the coupling portions 114 of the 3D orifice plate 108. A total seal 122 can more effectively prevent inert gas 118 from escaping the chamber 116 than a removable seal 122 that covers just the top 112 and/or openings 116 of the chamber 106.

As mentioned above, FIG. 2 shows an example substance detection device 100 that includes a layer of material 120 deposited over the substrate 102. The layer 120 comprises a sensing material layer 120 that can be deposited, for example, by sputtering the sensing material onto the substrate 102 to cover the tops of the nanostructures 104 and the areas in between the nanostructures 104. The sensing material layer 120 can be formed of nanoparticles including gold and/or silver and/or any other element or chemical that may react with, respond to, collect, etc., a substance of interest such as an analyte, in addition to providing an effective bonding material. Thus, in one aspect, the material layer 120 is deposited onto the nanostructures 104 to facilitate sensing of a substance. In another aspect, the material layer 120 is deposited onto the substrate 102 to facilitate bonding of the chamber walls 110 and/or coupling portions 114 of the chamber 106 (e.g., the 3D orifice plate 108) to the substrate 102.

Figure 3:
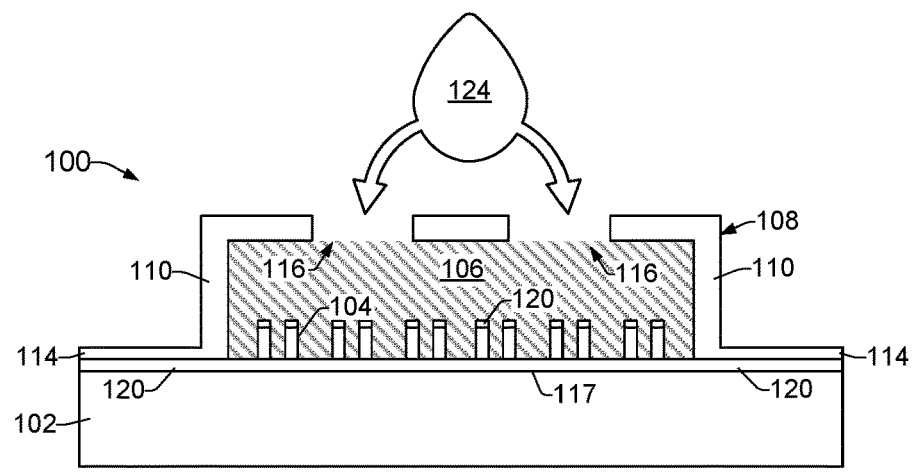
FIG. 3 shows an example substance detection device after a removable seal is removed from an orifice plate.

FIG. 3 illustrates an example substance detection device 100 after the removable seal 122 is removed from the outside of the chamber 106. Upon removal of the seal 122, the inert gas 118 escapes from the chamber 106, and a sample solution 124 can be introduced into the chamber 106 in preparation of detecting an analyte or substance of interest. A sample solution 124 may or may not contain the analyte/substance that the nanostructures 104 and/or nanoparticles of the sensing material layer 120 are intended to detect. In some examples, after the sample 124 is added to the chamber 106, a portion of the sample 124 evaporates leaving particles of the analyte or substance of interest on the nanostructures 104 and/or nanoparticles of the sensing material layer 120. In some examples, after the nanostructures 104 and/or nanoparticles in the sensing material layer 120 have been exposed to the sample 124, the chamber 106 can be covered again by the seal 122 and/or another seal to ensure that the nanostructures 104 and/or nanoparticles in the sensing material layer 120 are not contaminated through exposure to a non-testing environment after the test has occurred.

Figure 4:
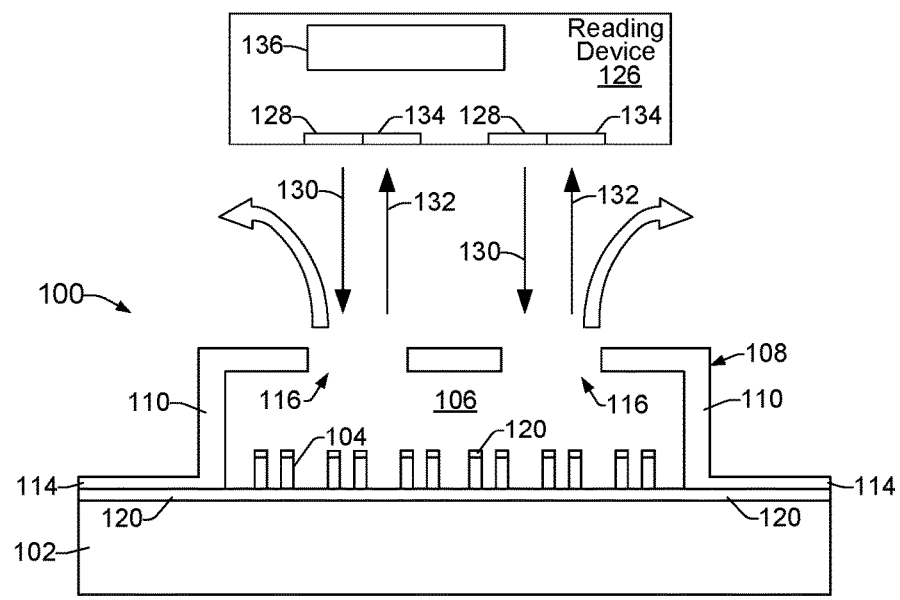
FIG. 4 shows an example of a substance detection device and an example reading device to analyze and detect a substance of interest within a chamber of the device.

FIG. 4 shows an example substance detection device 100 and an example reading device 126 to analyze and detect a substance of interest within the chamber 106 of the device 100. The example reading device 126 includes a light source 128 that emits photons 130 into the chamber 106. In the illustrated example, the photons 130 are scattered by the nanostructures 104 and/or nanoparticles in the sensing material layer 120. In some examples, some of the scattered photons 132 are detected and/or monitored by a spectrometer or photodetector 134 of the reading device 126. In some examples, the reading device 126 uses the detected and/or monitored photons 132 along with appropriate guiding and filtering components to generate substance detection results which can be displayed on a monitor 136. Substance detection results can include, for example, information relating to the presence or absence of a substance/analyte to be detected.

Figure 5:
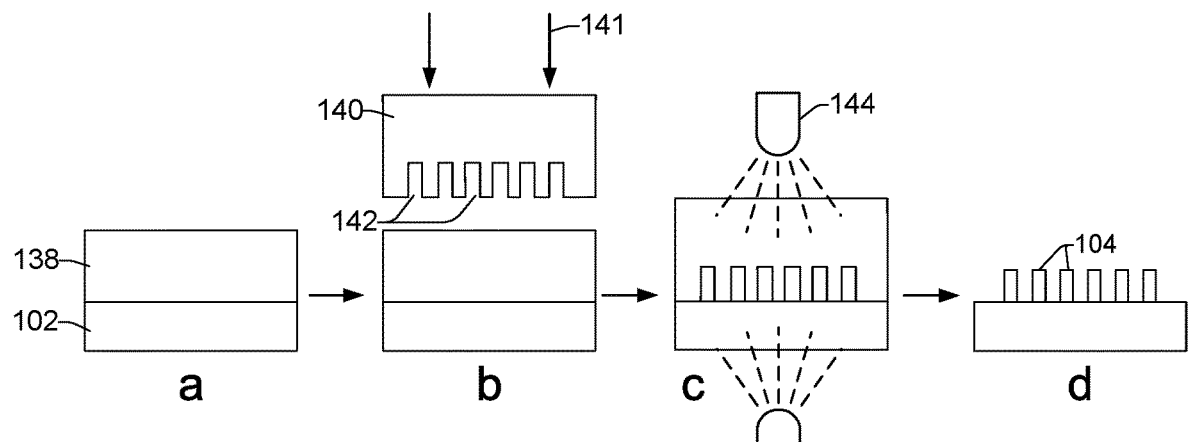
FIG. 5 shows an example process for making nanostructures on a substrate of a substance detection device.
Figure 6:
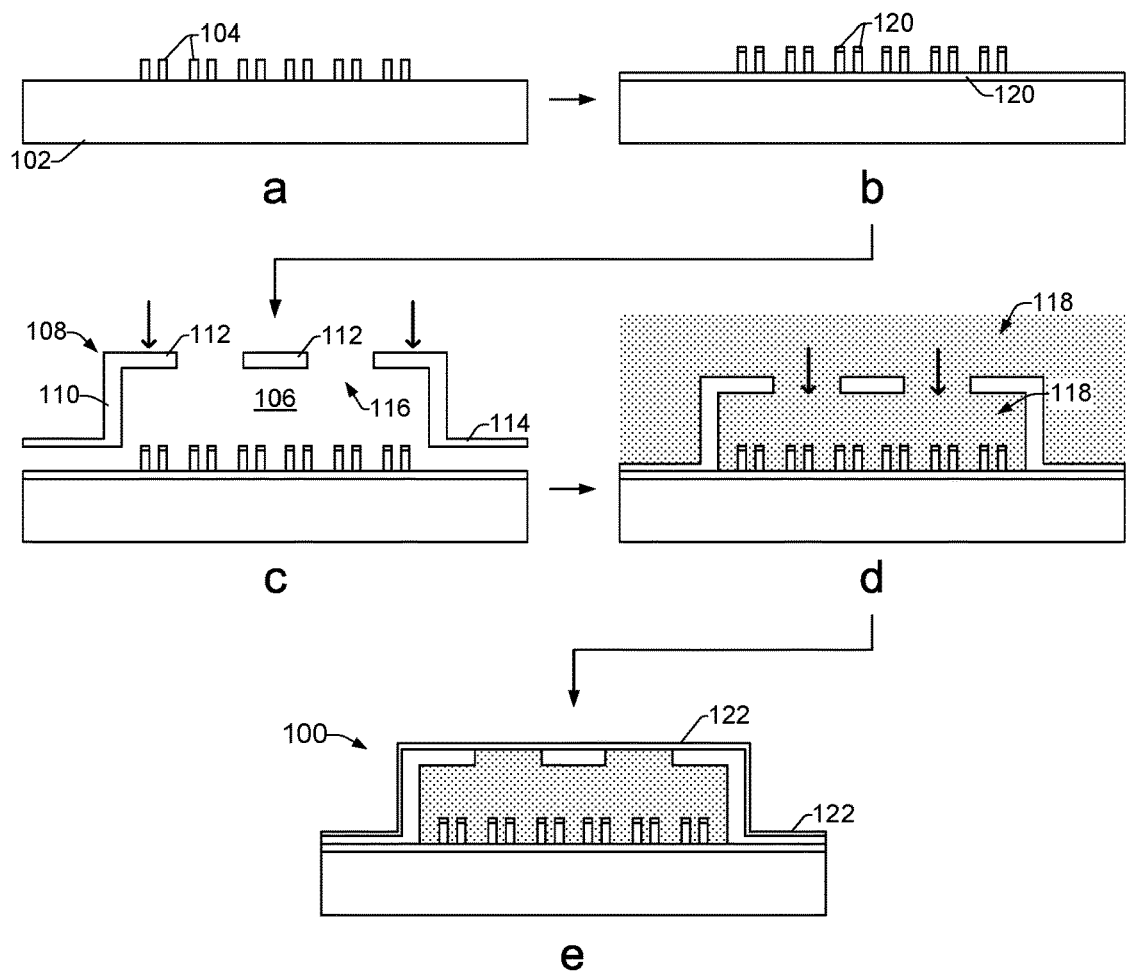
FIG. 6 shows an example process of making a substance detection device by attaching an orifice plate to a substrate and sealing an inert gas within a chamber.
Figure 7:
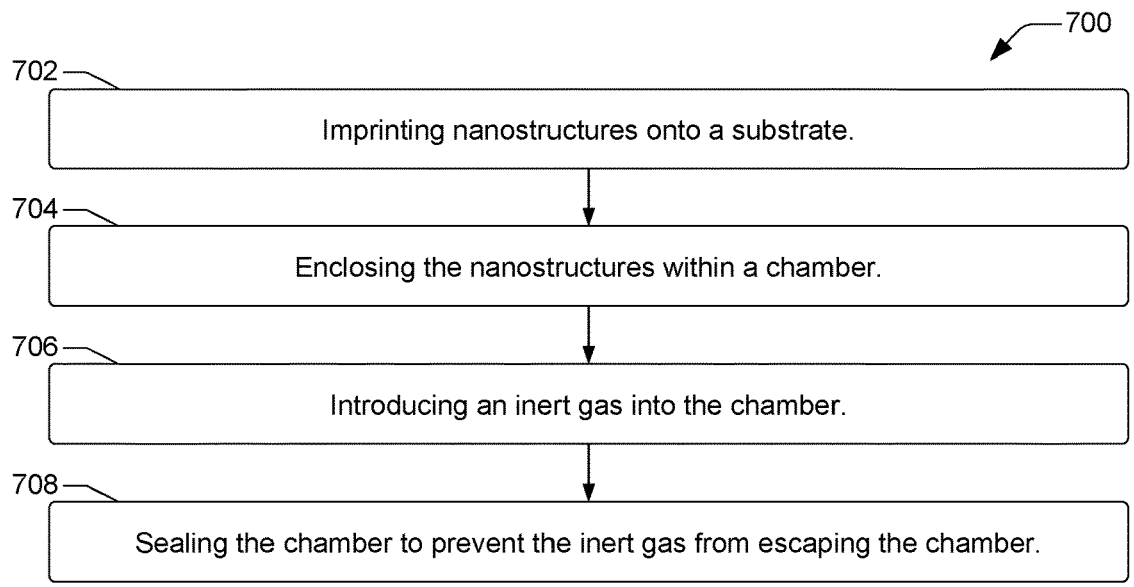
FIG. 7 shows a flow diagram of an example method of making a substance detection device that parallels the processes illustrated in FIGS. 5 and 6.
Figure 8:
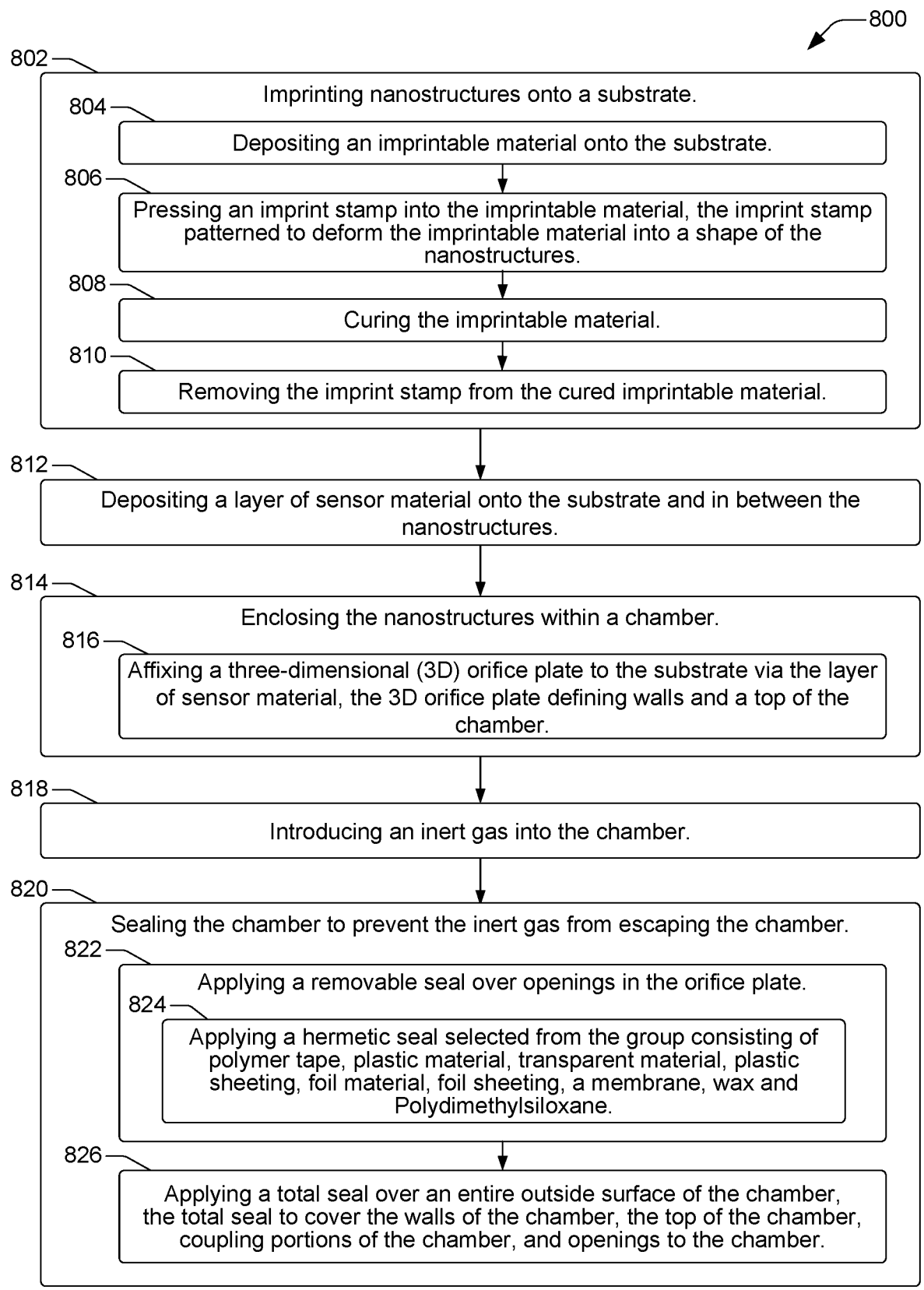
FIG. 8 shows a flow diagram of an alternate example method of making a substance detection device that parallels the processes illustrated in FIGS. 5 and 6.

FIGS. 5 and 6 illustrate an example process for making a substance detection device 100. More specifically, FIG. 5 illustrates an example process for making/fabricating nanostructures onto a substrate of a substance detection device 100, while FIG. 6 illustrates an example process of completing the fabrication of a substance detection device 100 by enclosing the nanostructures within a chamber and sealing an inert gas within the chamber. FIG. 7 is a flow diagram of an example method 700 of making a substance detection device that parallels the processes illustrated in FIGS. 5 and 6. FIG. 8 is a flow diagram of an alternate example method 800 of making a substance detection device that parallels the processes illustrated in FIGS. 5 and 6, including additional details.

Referring to FIGS. 5, 7, and 8, an example process for making nanostructures on a substrate of a substance detection device 100 is described. FIG. 5 shows a side view of an example substrate 102 that has an imprintable material 138 deposited thereon. The imprintable material 138 comprises a curable material such as a photo (UV) or thermal curable polymer resist. FIG. 5 (i.e., FIG. 5, a, through 5, d) illustrates the imprinting of nanostructures onto a substrate (FIG. 7, block 702; FIG. 8, block 802). At FIG. 5, a, the imprintable material 138 can be deposited onto the substrate 102 (FIG. 8, block 804) by various methods including spin coating and jetting from a nozzle, such as from an inkjet nozzle. At FIG. 5, b, the imprintable material 138 is imprinted with a master imprint stamp 140. More specifically, the imprint stamp 140 is pressed down into the imprintable material 138 as indicated by arrows 141, to cause a mechanical deformation of the imprint material 138 in the shape of nanometer scale patterns formed on the imprint stamp 140 (FIG. 8, block 806). In the illustrated example, the patterns formed on the imprint stamp include nanostructure patterns 142. Thus, at FIG. 5, b, nanostructures 104 are formed onto the substrate 102.

At FIG. 5, c, the imprintable material 138 is cured (FIG. 8, block 808). The cure can be a thermal cure or a UV cure. Thus, heat or UV light 144 can be applied to the imprintable material 138 until it is cured. In some examples, one or the other of the substrate 102 and the imprint stamp 140 can be formed of a transparent material such as fused silica (quartz) in order to enable ultraviolet (UV) curing of the imprintable material 138. Thus, UV light 144 can come through either the substrate 102 or the imprint stamp 140 to cure the imprintable material 138. In some examples, the UV light source 144 can comprise a heat source in the event the imprintable material 138 is thermally curable instead of UV curable.

At FIG. 5, d, the imprint stamp 140 can be removed from the cured imprintable material 138 (FIG. 8, block 810). Removing the imprint stamp 140 leaves behind deformations in the imprintable material 138 formed by the nanometer scale patterns 142 of the imprint stamp 140. Thus, the cured imprintable material 138 has the shape of the nanostructures 104.

Referring now to FIGS. 6, 7, and 8, an example process of completing the fabrication of a substance detection device 100 is described. As shown at FIG. 6, a, nanostructures 104 have been formed onto a substrate 102 using a nanoimprint process as shown in FIG. 5, and discussed above. At FIG. 6, b, a layer of sensor material 120 is deposited onto and in between the nanostructures 104 (FIG. 8, block 812). Depositing a layer of sensor material can include sputtering a layer of gold or other suitable material onto and in between the nanostructures 104. As shown at FIG. 6, c, the nanostructures are enclosed within a chamber (FIG. 8, block 814). Enclosing the nanostructures within a chamber can include affixing a three-dimensional (3D) orifice plate to the substrate via the layer of sensor material, where the 3D orifice plate defines walls, a top, and coupling portions of the chamber (FIG. 8, block 816). As shown at FIG. 6, d, an inert gas 118 is introduced into the chamber 106 (FIG. 7, block 706; FIG. 8, block 818). This can be done, for example, by passing the device through a micro-environment in which the atmosphere comprises the inert gas 118, or by fabricating the device in a room in which the atmosphere comprises the inert gas 118. The inert gas 118 can comprise various inert gases including nitrogen (N2), argon (Ar), helium (He), neon (Ne), Krypton (Kr), and Xenon (Xe). As shown at FIG. 6, e, the chamber 106 can be sealed to prevent the inert gas 118 from escaping (FIG. 7, block 708; FIG. 8, block 820). Sealing the chamber can include applying a removable seal over openings in the orifice plate (FIG. 8, block 822). The removable seal can be a hermetic seal selected from the group consisting of polymer tape, plastic material, transparent material, plastic sheeting, foil material, foil sheeting, a membrane, wax and Polydimethylsiloxane (FIG. 8, block 824). In some examples, sealing the chamber can include applying a total seal over an entire outside surface of the chamber (FIG. 8, block 826). The total seal is to cover the walls of the chamber, the top of the chamber, coupling portions of the chamber, and openings to the chamber.

What is claimed is:

1. A substance detection device comprising:
a chamber with chamber walls, a chamber top, and a chamber bottom;
a substrate coupled to the chamber walls to form the chamber bottom, the substrate comprising imprinted nanostructures positioned within the chamber;
a removable total seal to cover an entire outer surface of the chamber, including the chamber top and the chamber walls; and,
an inert gas sealed within the chamber by the removable total seal.

2. A device as in claim 1, further comprising a three-dimensional (3D) orifice plate that defines the chamber walls, the chamber top, and coupling portions bonded to the substrate.

3. A device as in claim 1, wherein the inert gas is a type of inert gas selected from the group consisting of nitrogen (N2), argon (Ar), helium (He), neon (Ne), Krypton (Kr), and Xenon (Xe).

4. A device as in claim 3, wherein the removable total seal is formed of a material selected based on which type of inert gas is sealed within the chamber.

5. A device as in claim 4, wherein the removable total seal is formed of a material selected from the group consisting of polymer tape, plastic material, transparent material, plastic sheeting, foil material, foil sheeting, a membrane, wax and/or Polydimethyl siloxane.

6. A method of making a substance detection device comprising:
imprinting nanostructures onto a substrate;
enclosing the nanostructures within a chamber;
introducing an inert gas into the chamber; and
sealing the chamber to prevent the inert gas from escaping the chamber by applying a total seal to an outside surface of the chamber, the outside surface of the chamber comprising a top of the chamber, openings formed in the top of the chamber, chamber walls, and coupling portions that couple the chamber walls to the substrate.

7. A method as in claim 6, further comprising depositing a layer of sensor material onto the substrate and in between the nanostructures.

8. A method as in claim 7, wherein enclosing the nanostructures within a chamber comprises:
affixing a three-dimensional (3D) orifice plate to the substrate via the layer of sensor material, the 3D orifice plate defining walls and a top of the chamber.

9. A method as in claim 6, wherein imprinting nanostructures onto a substrate comprises:
depositing an imprintable material onto the substrate;
pressing an imprint stamp into the imprintable material, the imprint stamp patterned to deform the imprintable material into a shape of the nanostructures;
curing the imprintable material; and,
removing the imprint stamp from the cured imprintable material.

10. A substance detection device comprising:
nanostructures imprinted onto a substrate and positioned within a chamber; and
inert gas sealed within the chamber by a removable total seal that covers openings in the chamber and an entire outside surface of the chamber.

11. A device as in claim 10, wherein:
the chamber comprises a top, walls, a bottom defined by the substrate, and coupling portions to couple the walls to the substrate; and
the removable total seal to cover the chamber top, walls, and coupling portions.

12. A device as in claim 10, wherein the nanostructures comprise a cured, imprintable material.

* * * * *